United States Patent
Hirata et al.

(10) Patent No.: US 10,828,726 B2
(45) Date of Patent: *Nov. 10, 2020

(54) SIC WAFER PRODUCING METHOD USING ULTRASONIC WAVE

(71) Applicant: DISCO CORPORATION, Tokyo (JP)

(72) Inventors: Kazuya Hirata, Tokyo (JP); Ryohei Yamamoto, Tokyo (JP)

(73) Assignee: DISCO CORPORATION, Tokyo (JP)

(*) Notice: Subject to any disclaimer, the term of this patent is extended or adjusted under 35 U.S.C. 154(b) by 103 days.

This patent is subject to a terminal disclaimer.

(21) Appl. No.: 15/892,660

(22) Filed: Feb. 9, 2018

(65) Prior Publication Data

US 2018/0229331 A1 Aug. 16, 2018

(30) Foreign Application Priority Data

Feb. 16, 2017 (JP) ................................. 2017-027114

(51) Int. Cl.
| | |
|---|---|
| *C30B 1/02* | (2006.01) |
| *B23K 26/53* | (2014.01) |
| *H01L 21/02* | (2006.01) |
| *H01L 29/16* | (2006.01) |
| *B23K 101/40* | (2006.01) |

(52) U.S. Cl.
CPC .......... *B23K 26/53* (2015.10); *H01L 21/0201* (2013.01); *H01L 21/02002* (2013.01); *H01L 29/1608* (2013.01); *B23K 2101/40* (2018.08)

(58) Field of Classification Search
CPC .. C30B 1/00; C30B 1/02; C30B 29/00; C30B 29/10; C30B 29/36; B23K 26/53; B23K 2101/40; H01L 21/02002; H01L 21/0201; H01L 29/1608

USPC .......................... 117/4, 7, 11, 902, 937, 951
See application file for complete search history.

(56) References Cited

U.S. PATENT DOCUMENTS

| | | | |
|---|---|---|---|
| 3,112,850 A | * | 12/1963 | Garibotti .............. B28D 5/0011 225/2 |
| 5,223,692 A | | 6/1993 | Lozier et al. |
| 5,561,544 A | | 10/1996 | Macken |

(Continued)

FOREIGN PATENT DOCUMENTS

| | | |
|---|---|---|
| JP | 2000094221 A | 4/2000 |
| JP | 2002373870 A | 12/2002 |

(Continued)

OTHER PUBLICATIONS

"Cutting Off-Axis Wafers," Viginia Semiconductor, Inc., Fredericksburg, VA, Aug. 2002, pp. 1-4, www.virginiasemi.com/?cont_uid=49.

(Continued)

*Primary Examiner* — Kenneth A Bratland, Jr.
(74) *Attorney, Agent, or Firm* — Greer Burns & Crain, Ltd.

(57) ABSTRACT

Disclosed herein is an SiC wafer producing method for producing an SiC wafer from a single crystal SiC ingot. The SiC wafer producing method includes a wafer producing step of separating a part of the ingot along a separation layer as an interface. The wafer producing step includes the steps of immersing the ingot in a liquid and applying the ultrasonic wave from an ultrasonic vibrator through the liquid to the ingot, the ultrasonic wave having a frequency greater than or equal to a critical frequency close to the natural frequency of the ingot.

5 Claims, 7 Drawing Sheets

(56) References Cited

U.S. PATENT DOCUMENTS

| | | |
|---|---|---|
| 5,581,572 A | 12/1996 | Delorme et al. |
| 5,912,186 A | 6/1999 | Yoshino et al. |
| 6,720,522 B2 | 4/2004 | Ikegami et al. |
| 7,160,790 B2 | 1/2007 | Henley et al. |
| 7,374,955 B2 | 5/2008 | Izumome |
| 7,566,635 B2 | 7/2009 | Fujii et al. |
| 7,737,001 B2 | 6/2010 | Abe et al. |
| 7,892,949 B2 | 2/2011 | Abe et al. |
| 8,148,184 B2 | 4/2012 | Koyanagi et al. |
| 8,263,479 B2 | 9/2012 | Fukuyo et al. |
| 8,415,234 B2 | 4/2013 | Abatake |
| 8,722,516 B2 | 5/2014 | Yamada et al. |
| 8,790,997 B2 | 7/2014 | Nakagawa et al. |
| 9,138,913 B2 | 9/2015 | Arai et al. |
| 9,174,305 B2 | 11/2015 | Morikazu et al. |
| 9,193,008 B2 | 11/2015 | Morikazu et al. |
| 9,478,696 B2 | 10/2016 | Tajikara et al. |
| 9,481,051 B2 | 11/2016 | Hirata et al. |
| 9,488,831 B2 | 11/2016 | Ito et al. |
| 9,517,530 B2 | 12/2016 | Hirata et al. |
| 9,620,415 B2 | 4/2017 | Hirata et al. |
| 9,757,815 B2 | 9/2017 | Hosseini |
| 9,789,565 B2 | 10/2017 | Hirata et al. |
| 9,850,160 B2 | 12/2017 | Marjanovic et al. |
| 9,878,397 B2 | 1/2018 | Hirata et al. |
| 9,925,619 B2 * | 3/2018 | Hirata .................... C30B 29/36 |
| 10,076,804 B2 * | 9/2018 | Hirata ................ B23K 26/0006 |
| 10,155,323 B2 * | 12/2018 | Hirata ..................... B26F 3/002 |
| 2003/0141505 A1 | 7/2003 | Isobe et al. |
| 2004/0002199 A1 | 1/2004 | Fukuyo et al. |
| 2004/0144301 A1 | 7/2004 | Neudeck et al. |
| 2005/0199592 A1 | 9/2005 | Iri et al. |
| 2005/0217560 A1 | 10/2005 | Tolchinsky et al. |
| 2006/0008941 A1 | 1/2006 | Haskell et al. |
| 2006/0079155 A1 | 4/2006 | Nakamura et al. |
| 2006/0148210 A1 | 7/2006 | Furuta et al. |
| 2006/0258047 A1 | 11/2006 | Nishiwaki et al. |
| 2007/0111480 A1 | 5/2007 | Maruyama et al. |
| 2007/0284764 A1 | 12/2007 | Sekiya |
| 2008/0008641 A1 | 1/2008 | Leonard et al. |
| 2008/0062430 A1 | 3/2008 | Horvath et al. |
| 2008/0070380 A1 | 3/2008 | Kusunoki |
| 2009/0056513 A1 * | 3/2009 | Baer ....................... B28D 1/221 83/15 |
| 2009/0084403 A1 * | 4/2009 | Shindo .............. H01L 21/67051 134/6 |
| 2009/0117712 A1 | 5/2009 | Sakamoto et al. |
| 2009/0127233 A1 | 5/2009 | Asano et al. |
| 2009/0320897 A1 | 12/2009 | Shimomura |
| 2010/0203706 A1 | 8/2010 | Ohnuma et al. |
| 2011/0088719 A1 * | 4/2011 | Mertens ............ H01L 21/67051 134/1.3 |
| 2011/0193269 A1 | 8/2011 | Ito et al. |
| 2011/0195536 A1 | 8/2011 | Koyanagi et al. |
| 2011/0195537 A1 | 8/2011 | Koyanagi et al. |
| 2011/0298084 A1 | 12/2011 | Tamemoto |
| 2012/0055546 A1 | 3/2012 | Turner |
| 2012/0111495 A1 | 5/2012 | Shimoi et al. |
| 2012/0234809 A1 | 9/2012 | Morikazu et al. |
| 2012/0289028 A1 | 11/2012 | Abatake |
| 2012/0298636 A1 | 11/2012 | Nomaru et al. |
| 2013/0037825 A1 | 2/2013 | Hiraiwa et al. |
| 2013/0171402 A1 | 7/2013 | Straubinger et al. |
| 2013/0248500 A1 | 9/2013 | Shreter et al. |
| 2014/0001679 A1 | 1/2014 | Okuma et al. |
| 2014/0038392 A1 | 2/2014 | Yonehara et al. |
| 2015/0038062 A1 | 2/2015 | Umeda et al. |
| 2015/0121960 A1 | 5/2015 | Hosseini |
| 2015/0217400 A1 | 8/2015 | Yamada |
| 2015/0376813 A1 | 12/2015 | Tsuchida et al. |
| 2016/0052090 A1 | 2/2016 | Tanigawa |
| 2016/0064229 A1 * | 3/2016 | Kim ..................... H01L 21/78 225/2 |
| 2016/0093763 A1 | 3/2016 | Rana et al. |
| 2016/0121426 A1 | 5/2016 | Hollinger et al. |
| 2016/0158881 A1 | 6/2016 | Hirata et al. |
| 2016/0163549 A1 | 6/2016 | Okuma et al. |
| 2016/0228984 A1 * | 8/2016 | Hirata ................ B23K 26/0006 |
| 2016/0293397 A1 | 10/2016 | Hirata et al. |
| 2016/0354862 A1 | 12/2016 | Hirata |
| 2016/0354863 A1 | 12/2016 | Hirata |
| 2017/0015017 A1 | 1/2017 | Hirata |
| 2017/0053829 A1 | 2/2017 | Hirata et al. |
| 2017/0250113 A1 | 8/2017 | Vanagas et al. |
| 2017/0355041 A1 | 12/2017 | Yamashita et al. |

FOREIGN PATENT DOCUMENTS

| | | | |
|---|---|---|---|
| JP | 2007019379 A | | 1/2007 |
| JP | 2013049161 A | * | 3/2013 |
| JP | 2016111143 A | | 6/2016 |
| WO | WO-2014171649 A1 | * | 10/2014 ............. B23K 26/40 |

OTHER PUBLICATIONS

Hirata, Kazuya, U.S. Appl. No. 15/165,259, filed May 26, 2016.

* cited by examiner

SIC WAFER PRODUCING METHOD USING ULTRASONIC WAVE

BACKGROUND OF THE INVENTION

Field of the Invention

The present invention relates to an SiC wafer producing method for producing an SiC wafer from a single crystal SiC ingot.

Description of the Related Art

Various devices such as ICs (integrated circuits), LSIs (large-scale integrations), and LEDs (light emitting diodes) are formed by forming a functional layer on the front side of a wafer formed of Si (silicon) or $Al_2O_3$ (sapphire) and partitioning this functional layer into a plurality of separate regions along a plurality of division lines. Further, power devices or optical devices such as LEDs are formed by forming a functional layer on the front side of a wafer formed of single crystal SiC (silicon carbide) and partitioning this functional layer into a plurality of separate regions along a plurality of division lines. The division lines of such a wafer having these devices are processed by a processing apparatus such as a cutting apparatus and a laser processing apparatus to thereby divide the wafer into a plurality of individual device chips corresponding to the devices. The device chips thus obtained are used in various electrical apparatuses such as mobile phones and personal computers.

In general, the wafer on which the devices are to be formed is produced by slicing a cylindrical ingot with a wire saw. Both sides of the wafer sliced from the ingot are polished to a mirror finish (see Japanese Patent Laid-Open No. 2000-94221). However, when the ingot is cut by the wire saw and both sides of each wafer are polished to obtain the product, a large proportion (70% to 80%) of the ingot is discarded to cause a problem of poor economy. In particular, a single crystal SiC ingot has high hardness and it is therefore difficult to cut this ingot with the wire saw. Accordingly, considerable time is required for cutting of the ingot, causing a reduction in productivity. Furthermore, since this ingot is high in unit price, there is a problem in efficiently producing a wafer in this prior art.

SUMMARY OF THE INVENTION

A technique for solving this problem has been proposed by the present applicant (see Japanese Patent Laid-Open No. 2016-111143). This technique includes the steps of setting the focal point of a laser beam having a transmission wavelength to single crystal SiC inside a single crystal SiC ingot, next applying the laser beam to the SiC ingot as scanning the laser beam on the SiC ingot to thereby form a separation layer in a separation plane previously set inside the SiC ingot, and next separating an SiC wafer from the SiC ingot along the separation layer.

However, this prior art technique has a problem such that it is difficult to separate the SiC wafer from the SiC ingot along the separation layer, causing a reduction in production efficiency.

It is therefore an object of the present invention to provide an SiC wafer producing method which can efficiently separate an SiC wafer from a single crystal SiC ingot.

In accordance with an aspect of the present invention, there is provided an SiC wafer producing method for producing an SiC wafer from a single crystal SiC ingot having an end surface, a c-axis intersecting the end surface, and a c-plane perpendicular to the c-axis, the SiC wafer producing method including a separation layer forming step of setting a focal point of a laser beam having a transmission wavelength to single crystal SiC inside the SiC ingot at a predetermined depth from the end surface, the predetermined depth corresponding to the thickness of the SiC wafer to be produced, and next applying the laser beam to the SiC ingot, thereby forming a plurality of modified portions on the c-plane at the predetermined depth and also forming a plurality of cracks isotropically formed on the c-plane so as to extend from each modified portion, each modified portion being a region where SiC has been decomposed into Si and C, the modified portions and the cracks constituting a separation layer along which the SiC wafer is to be separated from the SiC ingot; and a wafer producing step of, after the separation layer forming step, separating a part of the SiC ingot along the separation layer as an interface, thereby producing the SiC wafer; the wafer producing step including the steps of immersing the SiC ingot in a liquid in the condition where the end surface of the SiC ingot is opposed to an ultrasonic vibrator for generating ultrasonic wave, and next applying the ultrasonic wave from the ultrasonic vibrator through the liquid to the SiC ingot, the ultrasonic wave having a frequency greater than or equal to a critical frequency close to the natural frequency of the SiC ingot.

Preferably, the critical frequency close to the natural frequency of the SiC ingot is 0.8 times the natural frequency of the SiC ingot. Preferably, the liquid includes water, the temperature of the water being set to a temperature at which the occurrence of cavitation is suppressed. Preferably, the temperature of the water is in the range of 0° C. to 25° C.

Preferably, the c-axis coincides with a normal to the end surface of the SiC ingot; the separation layer forming step including a modified portion forming step of applying the laser beam to the SiC ingot in the condition where the focal point is set at the predetermined depth as relatively feeding the SiC ingot and the focal point in a feeding direction, thereby continuously forming the modified portions so that any adjacent ones of the modified portions overlap each other in the feeding direction; and an indexing step of relatively indexing the SiC ingot and the focal point in an indexing direction by a predetermined amount in the range not greater than the width of the cracks; the modified portion forming step and the indexing step being alternately performed to form the separation layer, in which the cracks adjacent to each other in the indexing direction are connected. In another case, the c-axis is inclined by an off angle with respect to a normal to the end surface of the SiC ingot; the separation layer forming step including a modified portion forming step of applying the laser beam to the SiC ingot in the condition where the focal point is set at the predetermined depth as relatively feeding the SiC ingot and the focal point in a first direction perpendicular to a second direction where the off angle is formed between the c-plane and the end surface, thereby continuously forming the modified portions so that any adjacent ones of the modified portions overlap each other in the first direction; and an indexing step of relatively indexing the SiC ingot and the focal point in the second direction by a predetermined amount in the range not greater than the width of the cracks; the modified portion forming step and the indexing step being alternately performed to form the separation layer, in which the cracks adjacent to each other in the second direction are connected.

According to the SiC wafer producing method of the present invention, the SiC wafer can be efficiently separated from the single crystal SiC ingot, so that the productivity can be improved.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

The SiC wafer producing method of the present invention is applicable regardless of whether or not the c-axis in a single crystal SiC ingot is inclined with respect to a normal to an end surface of the single crystal SiC ingot. In the case that the c-axis is not inclined with respect to the normal to the end surface, i.e., in the case that the c-axis coincides with the normal to the end surface, there will now be described a first preferred embodiment of the SiC wafer producing method of the present invention with reference to FIGS. 1 to 6B.

Figure 1:
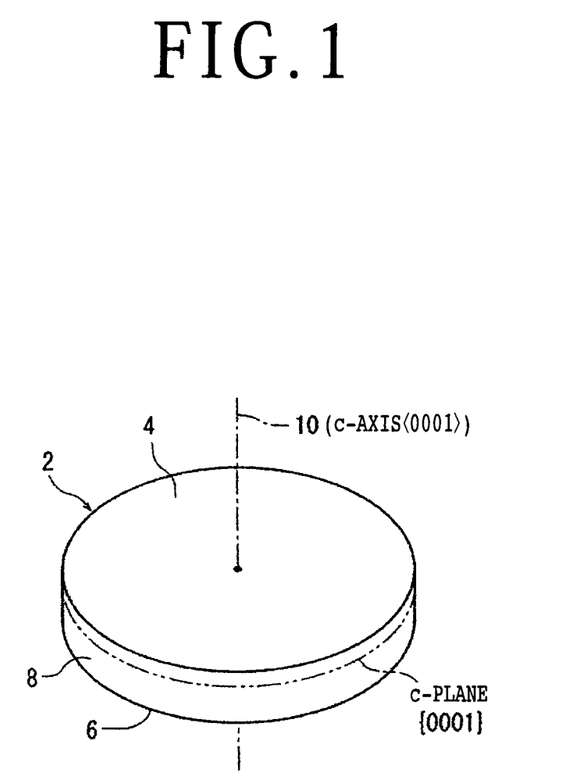
FIG. 1 is a perspective view of a single crystal SiC ingot having a c-axis coinciding with a normal to an end surface of the SiC ingot according to a first preferred embodiment of the present invention.

FIG. 1 shows a cylindrical hexagonal single crystal SiC ingot 2 (which will be hereinafter referred to simply as "ingot 2") as a workpiece to be processed. The ingot 2 has a circular first surface 4 (end surface), a circular second surface 6 opposite to the first surface 4, a cylindrical surface 8 formed so as to connect the first surface 4 and the second surface 6, a c-axis (<0001> direction) extending from the first surface 4 to the second surface 6, and a c-plane ({0001} plane) perpendicular to the c-axis. In the ingot 2, the c-axis is not inclined with respect to a normal 10 to the first surface 4. That is, the c-axis coincides with the normal 10.

Figure 2A:
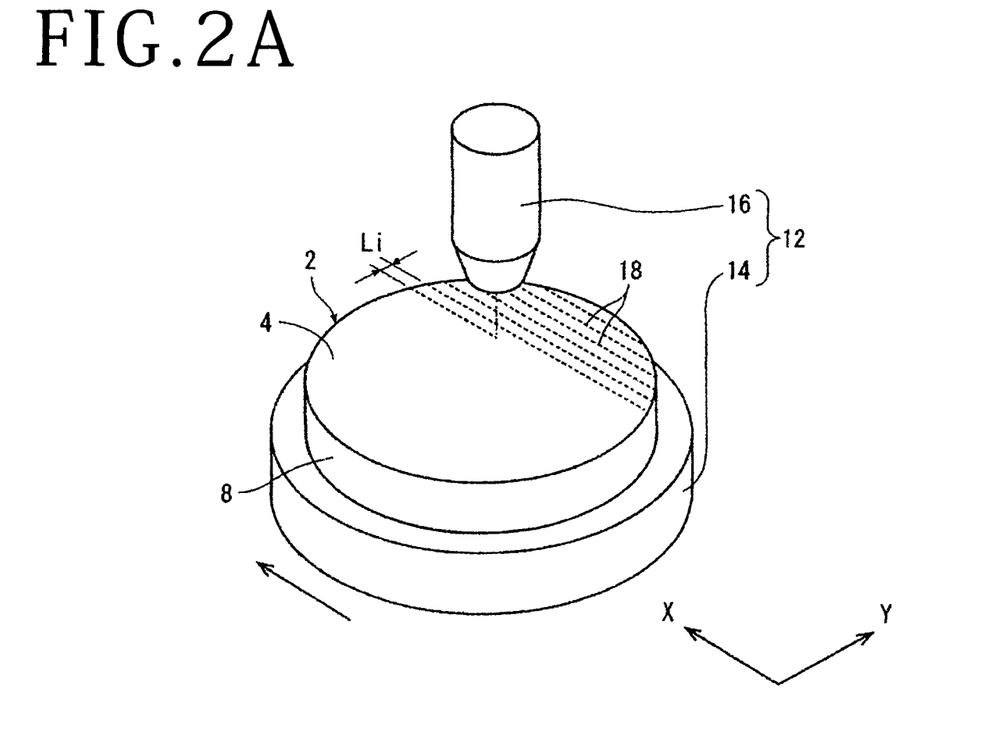
FIG. 2A is a perspective view showing a separation layer forming step of forming a separation layer in the SiC ingot shown in FIG. 1.
Figure 2B:
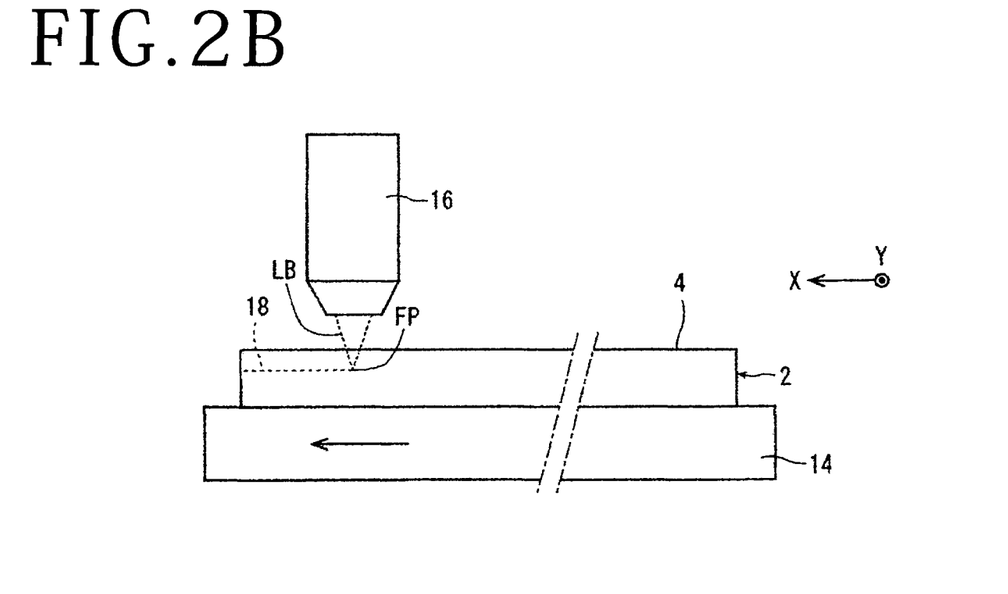
FIG. 2B is an elevational view of FIG. 2A.

In this preferred embodiment, a separation layer forming step is first performed to form a separation layer on the c-plane at a predetermined depth from the first surface 4, wherein this predetermined depth corresponds to the thickness of a wafer to be produced, and the separation layer is composed of a plurality of continuous modified portions where SiC has been decomposed into Si and C and a plurality of cracks isotropically formed on the c-plane so as to extend from each modified portion. This separation layer forming step may be performed by using a laser processing apparatus 12, a part of which is shown in FIGS. 2A and 2B. The laser processing apparatus 12 includes a chuck table 14 for holding a workpiece and focusing means 16 for applying a pulsed laser beam LB to the workpiece held on the chuck table 14. The chuck table 14 is rotatable about its axis extending in a vertical direction by rotating means (not shown). The chuck table 14 is movable in an X direction by X moving means (not shown) and also movable in a Y direction by Y moving means (not shown). Both the X moving means and the Y moving means are included in the laser processing apparatus 12. The focusing means 16 includes a focusing lens (not shown) for focusing a pulsed laser beam LB and applying it to a workpiece. The pulsed laser beam LB is oscillated from a laser oscillator (not shown) included in the laser processing apparatus 12. The pulsed laser beam LB oscillated from the laser oscillator is transmitted to the focusing means 16. The X direction is defined as the direction shown by an arrow X in FIG. 2A, and the Y direction is defined as the direction shown by an arrow Y in FIG. 2A, which is perpendicular to the X direction in an XY plane. The XY plane defined by the X direction and the Y direction is a substantially horizontal plane.

In the separation layer forming step, the ingot 2 is first fixed to the chuck table 14 in the condition where an adhesive (e.g., epoxy resin adhesive) is interposed between the second surface 6 of the ingot 2 and the upper surface of the chuck table 14. As a modification, the upper surface of the chuck table 14 may be formed with a plurality of suction holes, whereby a suction force may be produced on the upper surface of the chuck table 14 to thereby hold the ingot 2 under suction. Thereafter, imaging means (not shown) included in the laser processing apparatus 12 is operated to image the ingot 2 from the upper side of the first surface 4. Thereafter, the X moving means and the Y moving means of the laser processing apparatus 12 are operated to move the chuck table 14 according to the image of the ingot 2 detected by the imaging means, thereby adjusting the positional relation between the ingot 2 and the focusing means 16 in the XY plane. Thereafter, focal position adjusting means (not shown) included in the laser processing apparatus 12 is operated to vertically move the focusing means 16, thereby setting a focal point FP at a predetermined depth from the first surface 4, wherein this predetermined depth corresponds to the thickness of a wafer to be produced. Thereafter, a pulsed laser beam LB having a transmission wavelength to single crystal SiC is applied from the focusing means 16 to the ingot 2 as relatively moving the ingot 2 and the focal point FP (modified portion forming step).

Figure 3:
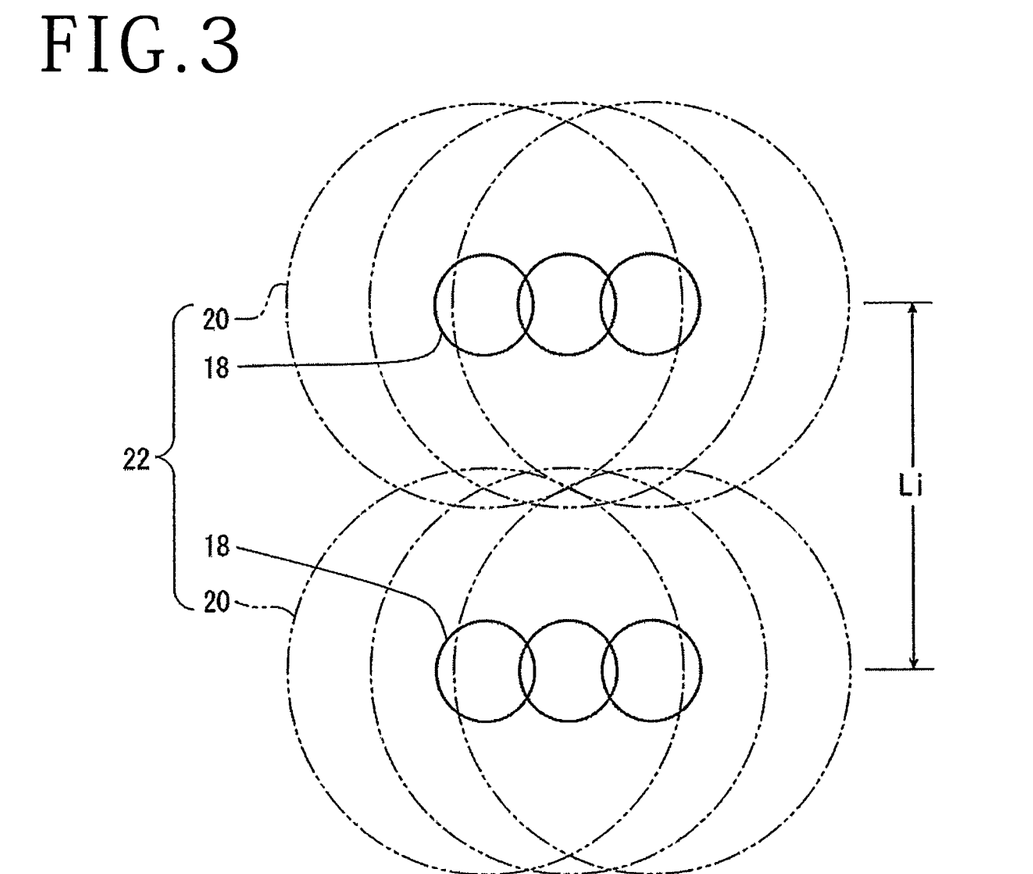
FIG. 3 is a schematic plan view showing modified portions and cracks constituting the separation layer.

In this preferred embodiment, the modified portion forming step is performed in the following manner as shown in FIGS. 2A and 2B. The X moving means is operated to move the chuck table 14 relative to the focal point FP in the X direction at a predetermined feed speed without moving the focal point FP. At the same time, the pulsed laser beam LB is applied from the focusing means 16 to the ingot 2. As a result, a plurality of modified portions 18 can be formed continuously on the c-plane at a predetermined depth from the first surface 4 so as to linearly extend in the X direction, wherein this predetermined depth corresponds to the thickness of a wafer to be produced. At the same time, as shown in FIG. 3, a plurality of cracks can be formed so as to extend isotropically from each modified portion 18 along the c-plane. Each modified portion 18 is a small circular region where SiC has been decomposed into Si and C by the application of the pulsed laser beam LB. In FIG. 3, the cracks extending isotropically from each modified portion 18 are represented by a circular area 20 shown by a phantom line.

Figure 4:
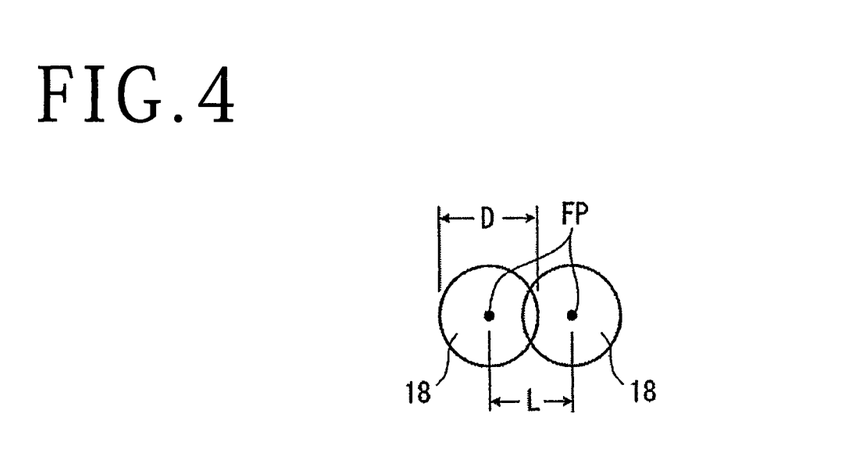
FIG. 4 is a schematic plan view of the adjacent modified portions continuously formed.

Referring to FIG. 4, D denotes the diameter of each modified portion 18 and L denotes the spacing between the adjacent focal points FP spaced in the feeding direction (X direction), wherein the cracks 20 are formed isotropically from each modified portion 18 on the c-plane in a region where the relation of D>L is satisfied (i.e., the adjacent modified portions 18 arranged in the feeding direction, or in the X direction are overlapped). The spacing L between the adjacent focal points FP spaced in the feeding direction is defined by the relative speed V between the focal point FP and the chuck table 14 and the repetition frequency F of the pulsed laser beam LB (L=V/F). In this preferred embodiment, the relation of D>L can be satisfied by adjusting the feed speed V of the chuck table 14 in the X direction relative to the focal point FP and the repetition frequency F of the pulsed laser beam LB.

After performing the modified portion forming step along a line in the X direction, the ingot 2 and the focal point FP are relatively moved in the Y direction by a predetermined index amount in the range not greater than the width of the cracks 20. In this preferred embodiment, the chuck table 14 is moved relative to the focal point FP in the Y direction by a predetermined index amount Li by operating the Y moving means in the range not greater than the width of the cracks 20 (i.e., the diameter of the circular area 20 in FIG. 3) (indexing step). Thereafter, the modified portion forming step and the indexing step are alternately performed plural times, so that a plurality of linear modified layers extending in the X direction are formed so as to be spaced by the index amount Li in the Y direction, wherein each linear modified layer is composed of the plural modified portions 18 overlapped in the X direction. Furthermore, the cracks 20 adjacent to each other in the Y direction can be connected. Accordingly, a separation layer 22 composed of the plural modified portions 18 and the plural cracks 20 can be formed on the c-plane at the predetermined depth from the first surface 4, which depth corresponds to the thickness of a wafer to be produced, wherein SiC has been decomposed into Si and C in each modified portion 18. As a modification, the modified portion forming step may be repeated plural times (e.g., four times) along the same straight line.

Figure 5:
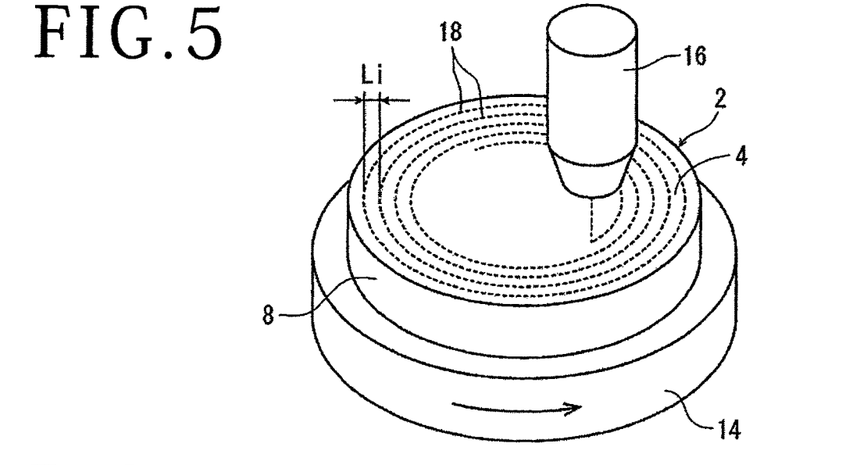
FIG. 5 is a perspective view showing a modification of the separation layer forming step, wherein the modified portions are formed continuously along the circumference of the SiC ingot.

As described above, the modified portion forming step in the separation layer forming step may be performed by relatively moving the ingot 2 and the focal point FP. Accordingly, as a modification, the modified portion forming step may be performed by rotating the chuck table 14 as shown in FIG. 5. More specifically, the rotating means (not shown) is operated to rotate the chuck table 14 at a predetermined speed relative to the focal point FP fixed in the counterclockwise direction (or in the clockwise direction) as viewed in plan. At the same time, the pulsed laser beam LB having a transmission wavelength to single crystal SiC is applied from the focusing means 16 to the ingot 2. As a result, a plurality of modified portions 18 are continuously formed on the c-plane at the predetermined depth from the first surface 4, which depth corresponds to the thickness of a wafer to be produced, in such a manner that an annular modified layer is formed by these plural modified portions 18 along the circumference of the ingot 2, wherein SiC has been decomposed into Si and C in each modified portion 18. At the same time, a plurality of cracks 20 can be formed on the c-plane so as to extend isotropically from each modified portion 18. As described above, the cracks 20 are formed isotropically from each modified portion 18 along the c-plane in the region where the relation of D>L is satisfied, in which D denotes the diameter of each modified portion 18 and L denotes the spacing between the adjacent focal points FP spaced in the feeding direction. Further, the spacing L is defined by the relative speed V between the focal point FP and the chuck table 14 and the repetition frequency F of the pulsed laser beam LB (L=V/F). In the case shown in FIG. 5, the relation of D>L can be satisfied by adjusting the peripheral speed V of the chuck table 14 relative to the focal point FP at the position of the focal point FP and the repetition frequency F of the pulsed laser beam LB.

In the case shown in FIG. 5 where the modified portion forming step is performed by rotating the chuck table 14, the indexing step is next performed by operating the X moving means or the Y moving means to move the chuck table 14 relative to the focal point FP in the radial direction of the ingot 2 by the predetermined index amount Li in the range not greater than the width of the cracks 20. Thereafter, the modified portion forming step and the indexing step are alternately performed plural times, so that a plurality of annular modified layers extending along the circumference of the ingot 2 are formed concentrically so as to be spaced by the index amount Li in the radial direction of the ingot 2, wherein each annular modified layer is composed of the plural modified portions 18 overlapped in the circumferential direction of the ingot 2. Further, the cracks 20 adjacent to each other in the radial direction of the ingot 2 can be connected. Accordingly, a similar separation layer 22 composed of the plural modified portions 18 and the plural cracks 20 can be formed on the c-plane at the predetermined depth from the first surface 4, which depth corresponds to the thickness of a wafer to be produced. As a modification, also in the case of FIG. 5, the modified portion forming step may be repeated plural times (e.g., four times) along the same circular line.

After performing the separation layer forming step, a wafer producing step is performed to separate a part of the ingot 2 along the separation layer 22 as an interface, thereby producing a wafer. The wafer producing step may be performed by using a separating apparatus 24 shown in FIG. 6A. The separating apparatus 24 includes a liquid bath 28 for storing a liquid 26, an ultrasonic vibrator 30 located in the liquid bath 28, ultrasonic vibration applying means 32 for applying ultrasonic vibration to the ultrasonic vibrator, and holding means 34 for holding a workpiece. The holding means 34 includes an arm 36 extending in a substantially vertical direction and a suction member 38 fixed to the lower end of the arm 36. The suction member 38 has a lower surface for holding the workpiece under suction.

Figure 6A:
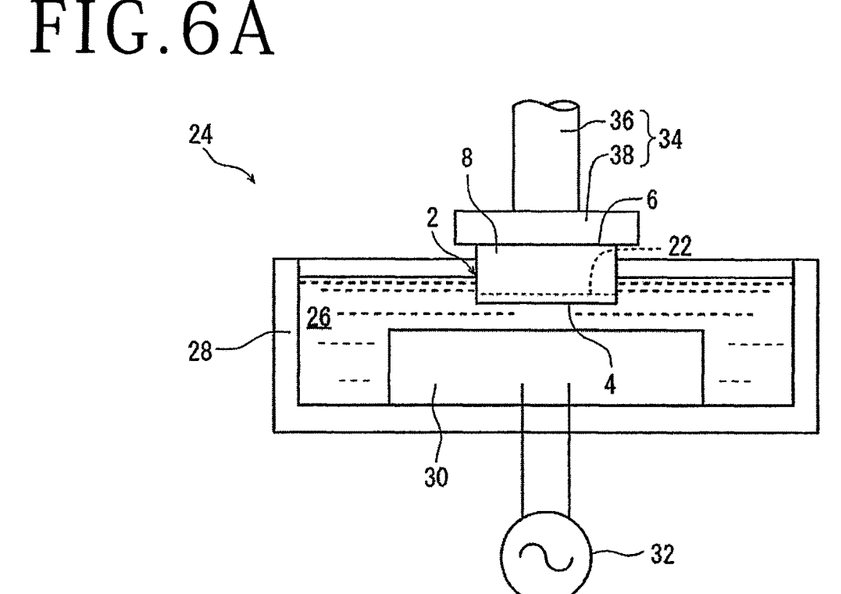
FIG. 6A is an elevational view showing a wafer producing step.
Figure 6B:
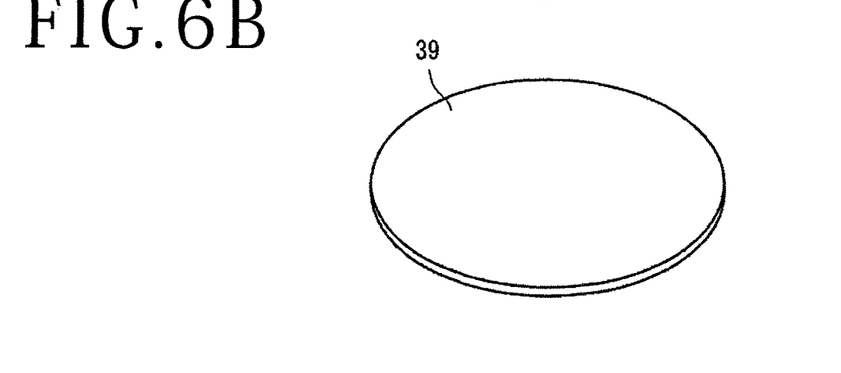
FIG. 6B is a perspective view of an SiC wafer produced by performing the wafer producing step shown in FIG. 6A.

In the wafer producing step, the ingot 2 in which the separation layer 22 has been formed is first held under suction on the lower surface of the suction member 38 of the holding means 34 in the condition where the second surface 6 of the ingot 2 is oriented upward, i.e., the first surface 4 of the ingot 2 is exposed downward. That is, the second surface 6 is an end surface far from the separation layer 22, and the first surface 4 is an end surface close to the separation layer 22. Thereafter, elevating means (not shown) included in the separating apparatus 24 is operated to lower the holding means 34 until a lower portion of the ingot 2 is immersed into the liquid 26 and the first surface 4 of the ingot 2 is opposed to the upper surface of the ultrasonic vibrator 30 with a given gap (e.g., approximately 4 to 5 mm) defined therebetween. Thereafter, ultrasonic vibration having a frequency greater than or equal to a critical frequency close to the natural frequency of the ingot 2 is applied from the ultrasonic vibration applying means 32 to the ultrasonic vibrator 30. As a result, ultrasonic wave having a frequency greater than or equal to the critical frequency close to the natural frequency of the ingot 2 is applied from the ultrasonic vibrator 30 through the liquid 26 to the ingot 2. Accordingly, a part of the ingot 2 can be efficiently separated along the separation layer 22 as an interface to thereby produce a wafer 39 shown in FIG. 6B. Accordingly, the productivity can be improved. In this preferred embodiment, the ingot 2 is located at an upper position in the liquid bath 28, and the ultrasonic vibrator 30 is located at a lower position in the liquid bath 28 as shown in FIG. 6A. However, in the wafer producing step according to the present invention, it is essential that the first surface 4 as the wafer forming side of the ingot 2 is to be opposed to the ultrasonic vibrator 30. Accordingly, as a modification, the ingot 2 may be located at a lower position in the liquid bath 28, and the ultrasonic vibrator 30 may be located at an upper position in the liquid bath 28. As another modification, the wafer forming side of the ingot 2 may be opposed to the ultrasonic vibrator 30 in any directions other than the vertical direction (e.g., in a horizontal direction). Further, the holding means 34 may be oscillated by any suitable oscillating means (not shown) in applying ultrasonic vibration from the ultrasonic vibrator 30 to the ingot 2.

The above-mentioned critical frequency close to the natural frequency of the ingot 2 is defined in the following manner. In applying ultrasonic wave from the ultrasonic vibrator 30 through the liquid 26 to the ingot 2 immersed in the liquid 26 to thereby separate a part of the ingot 2 along the separation layer 22 as an interface, the frequency of the ultrasonic wave is gradually increased from a frequency lower than the natural frequency of the ingot 2 by a predetermined amount. When the frequency of the ultrasonic wave has reached a certain frequency, a part of the ingot 2 starts to be separated along the separation layer 22 as an interface at this certain frequency. This certain frequency is defined as the critical frequency close to the natural frequency of the ingot 2. That is, the critical frequency close to the natural frequency of the ingot 2 is lower than the natural frequency of the ingot 2. Preferably, the critical frequency close to the natural frequency of the ingot 2 is approximately 0.8 times the natural frequency of the ingot 2. The liquid 26 stored in the liquid bath 28 is preferably water, and the temperature of the water is preferably set to a temperature at which the occurrence of cavitation can be suppressed in applying ultrasonic vibration from the ultrasonic vibration applying means 32 to the ultrasonic vibrator 30. More specifically, the temperature of the water is preferably set to 0° C. to 25° C. In this condition, there is no possibility that the energy of the ultrasonic wave may be converted into cavitation, so that the energy of the ultrasonic wave can be effectively applied to the ingot 2.

In the case that the c-axis in a single crystal SiC ingot is inclined with respect to the normal to the end surface, there will now be described a second preferred embodiment of the SiC wafer producing method of the present invention with reference to FIGS. 7A to 9B.

Figure 7A:
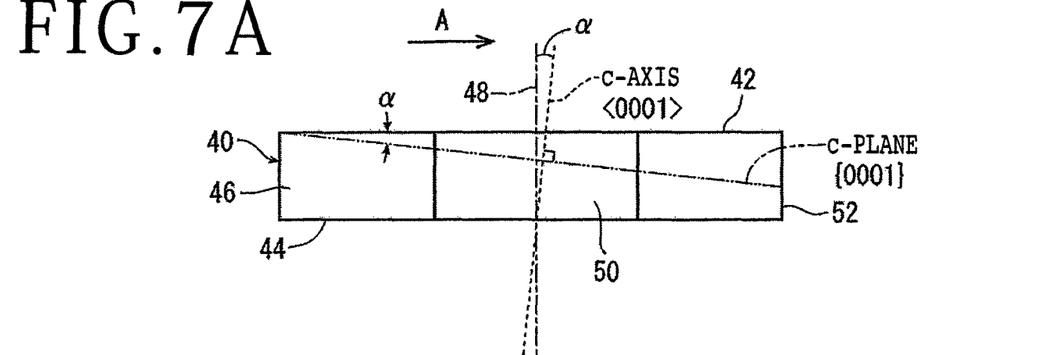
FIG. 7A is an elevational view of a single crystal SiC ingot having a c-axis inclined with respect to a normal to an end surface of the SiC ingot according to a second preferred embodiment of the present invention.
Figure 7B:
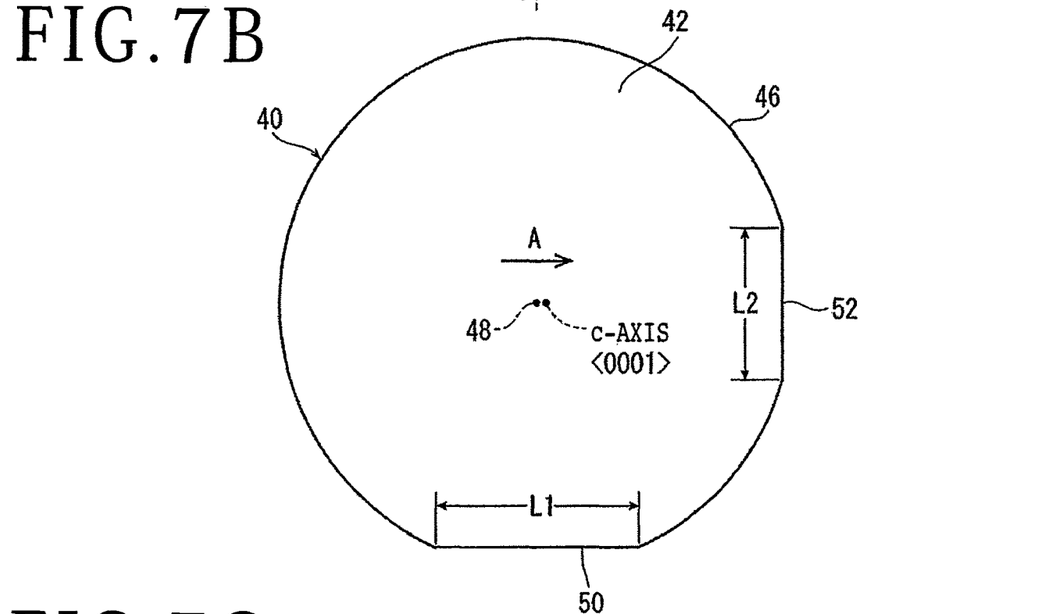
FIG. 7B is a plan view of the SiC ingot shown in FIG. 7A.
Figure 7C:
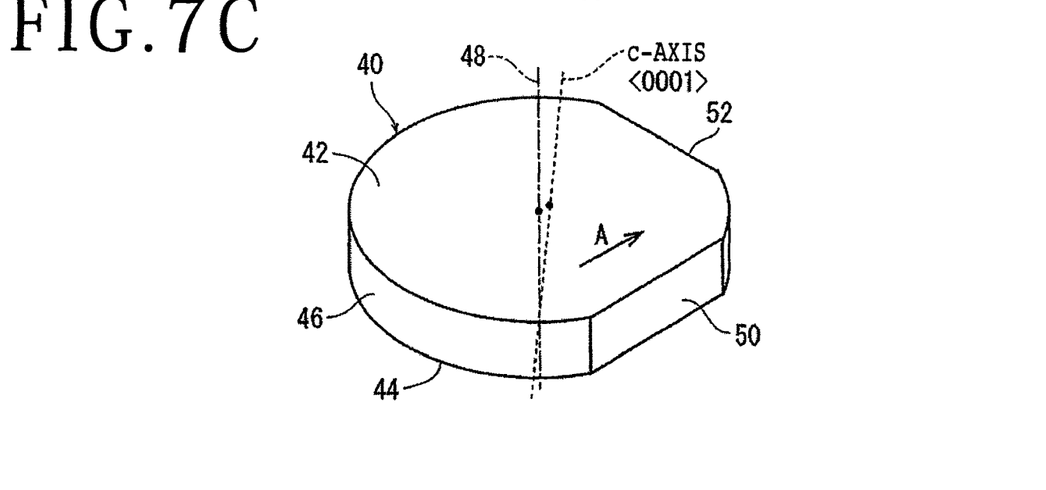
FIG. 7C is a perspective view of the SiC ingot shown in FIG. 7A.

FIGS. 7A to 7C show a generally cylindrical hexagonal single crystal SiC ingot 40 (which will be hereinafter referred to simply as "ingot 40") as a workpiece to be processed. The ingot 40 has a substantially circular first surface 42 (end surface), a substantially circular second surface 44 opposite to the first surface 42, a substantially cylindrical surface 46 formed so as to connect the first surface 42 and the second surface 44, a c-axis (<0001> direction) extending from the first surface 42 to the second surface 44, and a c-plane ({0001} plane) perpendicular to the c-axis. In the ingot 40, the c-axis is inclined by an off angle $\alpha$ (e.g., $\alpha$=1, 3, or 6 degrees) with respect to a normal 48 to the first surface 42. The off angle $\alpha$ is formed between the c-plane and the first surface 42. The direction of formation of the off angle $\alpha$ is shown by an arrow A in FIGS. 7A to 7C. Further, the cylindrical surface 46 of the ingot 40 is formed with a first orientation flat 50 and a second orientation flat 52, which are rectangular in side elevation and function to indicate crystal orientation. The first orientation flat 50 is parallel to the direction A of formation of the off angle $\alpha$, and the second orientation flat 52 is perpendicular to the direction A of formation of the off angle $\alpha$. As shown in FIG. 7B, which is a plan view taken in the direction of extension of the normal 48, the length L2 of the second orientation flat 52 is set shorter than the length L1 of the first orientation flat 50 (L2<L1).

Figure 8A:
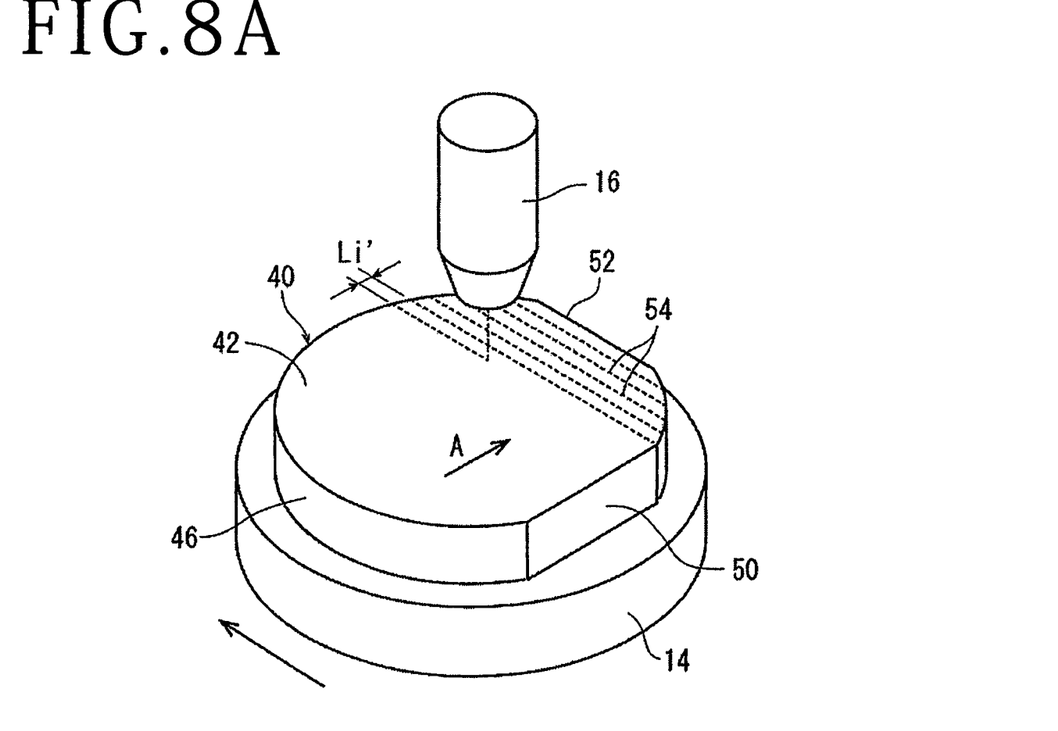
FIG. 8A is a perspective view showing a separation layer forming step of forming a separation layer in the SiC ingot shown in FIGS. 7A to 7C.

In this preferred embodiment, a separation layer forming step is first performed to form a separation layer on the c-plane at a predetermined depth from the first surface 42, wherein this predetermined depth corresponds to the thickness of a wafer to be produced, and the separation layer is composed of a plurality of continuous modified portions where SiC has been decomposed into Si and C and a plurality of cracks isotropically formed on the c-plane so as to extend from each modified portion. This separation layer forming step may be performed by using the laser processing apparatus 12 mentioned above. In the separation layer forming step, the ingot 40 is first fixed to the chuck table 14 in the condition where an adhesive (e.g., epoxy resin adhesive) is interposed between the second surface 44 of the ingot 40 and the upper surface of the chuck table 14. As a modification, the upper surface of the chuck table 14 may be formed with a plurality of suction holes, whereby a suction force may be produced on the upper surface of the chuck table 14 to thereby hold the ingot 40 under suction. Thereafter, the imaging means of the laser processing apparatus 12 is operated to image the ingot 40 from the upper side of the first surface 42. Thereafter, the X moving means, the Y moving means, and the rotating means of the laser processing apparatus 12 are operated to move and rotate the chuck table 14 according to the image of the ingot 40 detected by the imaging means, thereby adjusting the orientation of the ingot 40 to a predetermined orientation and also adjusting the positional relation between the ingot 40 and the focusing means 16 in the XY plane. In adjusting the orientation of the ingot 40 to a predetermined orientation, the first orientation flat 50 is made parallel to the Y direction and the second orientation flat 52 is made parallel to the X direction as shown in FIG. 8A. Accordingly, the direction A of formation of the off angle α is made parallel to the Y direction, and the direction perpendicular to the direction A of formation of the off angle α is made parallel to the X direction.

Thereafter, the focal position adjusting means of the laser processing apparatus 12 is operated to vertically move the focusing means 16, thereby setting a focal point FP at a predetermined depth from the first surface 42, wherein this predetermined depth corresponds to the thickness of a wafer to be produced. Thereafter, a pulsed laser beam LB having a transmission wavelength to single crystal SiC is applied from the focusing means 16 to the ingot 40 as relatively moving the ingot 40 and the focal point FP in the X direction (i.e., in the direction perpendicular to the direction A of formation of the off angle α) (modified portion forming step). In the present invention, the direction perpendicular to the direction A of formation of the off angle α is defined as a first direction, and the direction A of formation of the off angle α is defined as a second direction.

Figure 8B:
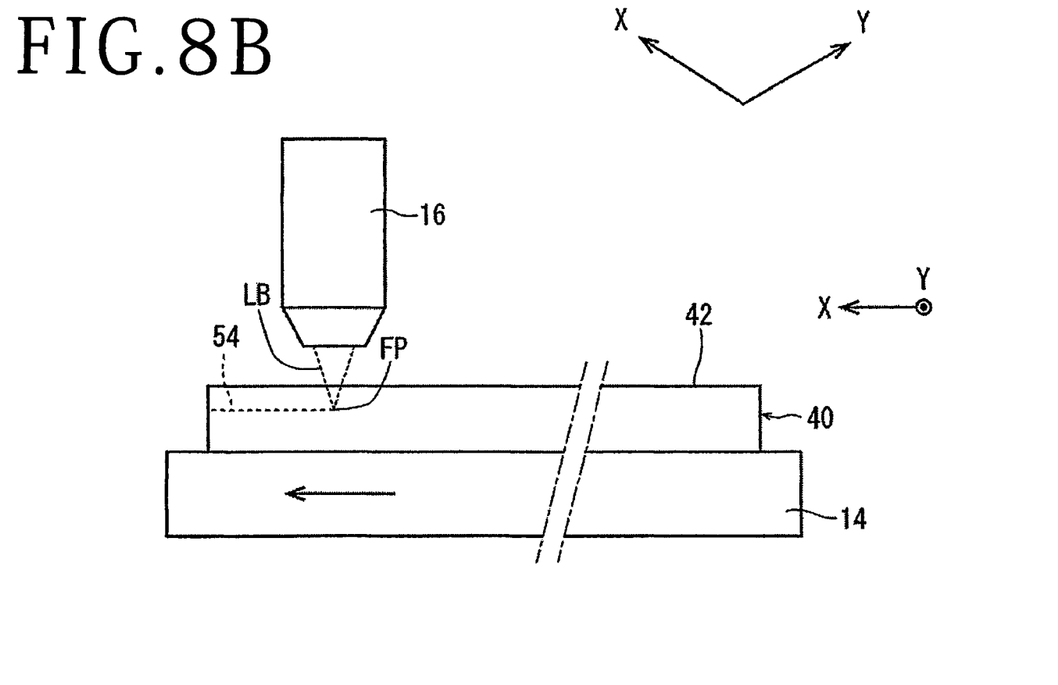
FIG. 8B is an elevational view of FIG. 8A.
Figure 9A:
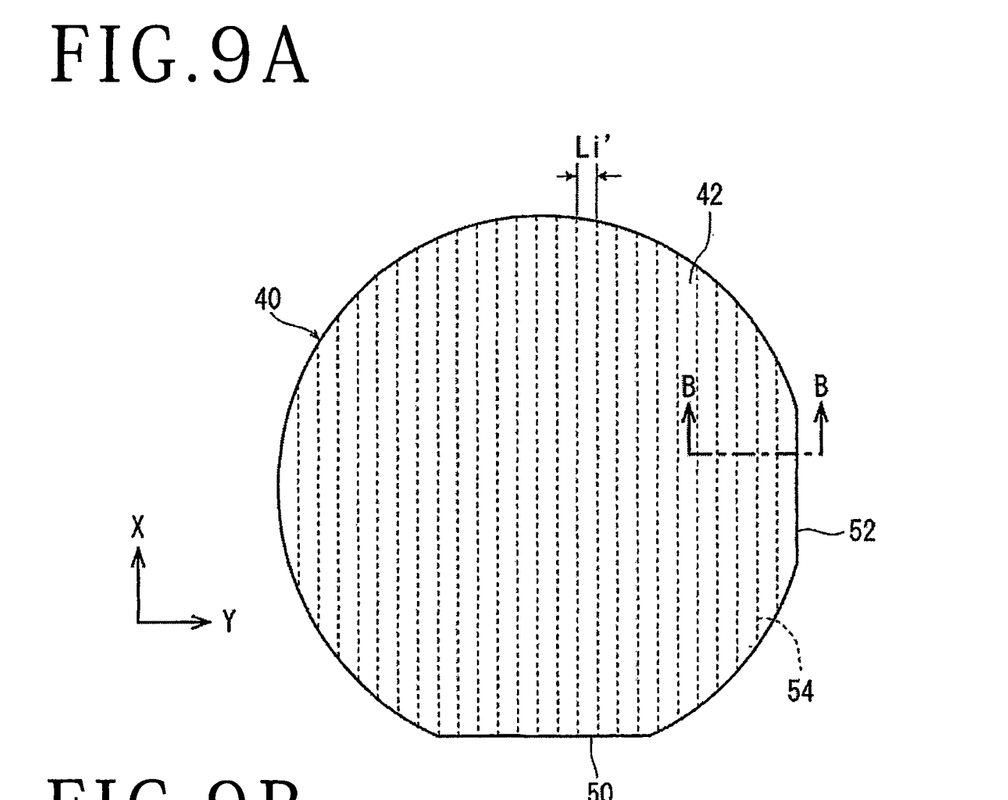
FIG. 9A is a plan view of the SiC ingot processed by the separation layer forming step shown in FIGS. 8A and 8B.
Figure 9B:
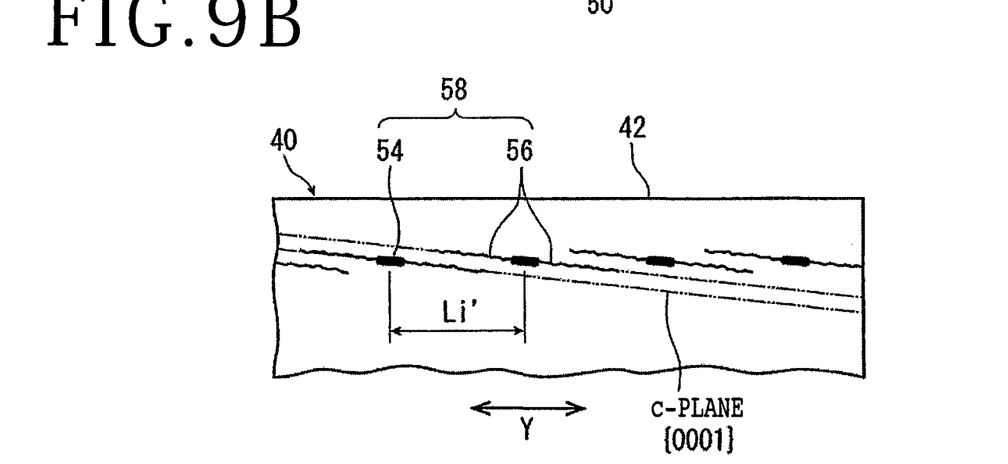
FIG. 9B is a cross section taken along the line B-B in FIG. 9A.

In this preferred embodiment, the modified portion forming step is performed in the following manner as shown in FIGS. 8A and 8B. The X moving means is operated to move the chuck table 14 relative to the focal point FP in the X direction (i.e., in the direction perpendicular to the direction A of formation of the off angle α) at a predetermined feed speed without moving the focal point FP. At the same time, the pulsed laser beam LB is applied from the focusing means 16 to the ingot 40. As a result, a plurality of modified portions 54 can be formed continuously on the c-plane at a predetermined depth from the first surface 42 so as to linearly extend in the X direction (i.e., in the direction perpendicular to the direction A of formation of the off angle α), wherein this predetermined depth corresponds to the thickness of a wafer to be produced. At the same time, as shown in FIG. 9B, a plurality of cracks 56 can be formed so as to extend isotropically from each modified portion 54 along the c-plane. Each modified portion 54 is a small circular region where SiC has been decomposed into Si and C by the application of the pulsed laser beam LB. Further, the cracks 56 extending isotropically from each modified portion 54 are formed as a circular area as shown in FIG. 3.

As described above, letting D denote the diameter of each modified portion 54 and L denote the spacing between the adjacent focal points FP spaced in the feeding direction (X direction), the cracks 56 are formed isotropically from each modified portion 54 on the c-plane in a region where the relation of D>L is satisfied. The spacing L between the adjacent focal points FP spaced in the feeding direction is defined by the relative speed V between the focal point FP and the chuck table 14 and the repetition frequency F of the pulsed laser beam LB (L=V/F). In this preferred embodiment, the relation of D>L can be satisfied by adjusting the feed speed V of the chuck table 14 in the X direction relative to the focal point FP and the repetition frequency F of the pulsed laser beam LB.

After performing the modified portion forming step along a line in the X direction, the ingot 40 and the focal point FP are relatively moved in the Y direction (i.e., in the direction A of formation of the off angle α) by a predetermined index amount in the range not greater than the width of the cracks 56. In this preferred embodiment, the chuck table 14 is moved relative to the focal point FP in the Y direction by a predetermined index amount Li' by operating the Y moving means in the range not greater than the width of the cracks 56 (indexing step). Thereafter, the modified portion forming step and the indexing step are alternately performed plural times, so that a plurality of linear modified layers extending in the X direction (i.e., in the direction perpendicular to the direction A of formation of the off angle α) are formed so as to be spaced by the index amount Li' in the Y direction (i.e., in the direction A of formation of the off angle α), wherein each linear modified layer is composed of the plural modified portions 54 overlapped in the X direction. Furthermore, the cracks 56 adjacent to each other in the Y direction can be connected. Accordingly, a separation layer 58 composed of the plural modified portions 54 and the plural cracks 56 can be formed at the predetermined depth from the first surface 42, which depth corresponds to the thickness of a wafer to be produced, wherein SiC has been decomposed into Si and C in each modified portion 54. As a modification, the modified portion forming step may be repeated plural times (e.g., four times) along the same straight line.

After performing the separation layer forming step, a wafer producing step is performed to separate a part of the ingot 40 along the separation layer 58 as an interface, thereby producing a wafer. The wafer producing step may be performed by using the separating apparatus 24 mentioned above. In the wafer producing step, the ingot 40 in which the separation layer 58 has been formed is first held under suction on the lower surface of the suction member 38 of the holding means 34 in the condition where the second surface 44 of the ingot 40 is oriented upward, i.e., the first surface 42 of the ingot 40 is exposed downward. That is, the second surface 44 is an end surface far from the separation layer 58, and the first surface 42 is an end surface close to the separation layer 58. Thereafter, the elevating means of the separating apparatus 24 is operated to lower the holding means 34 until a lower portion of the ingot 40 is immersed into the liquid 26 and the first surface 42 of the ingot 40 is opposed to the upper surface of the ultrasonic vibrator 30 with a given gap (e.g., approximately 4 to 5 mm) defined therebetween. Thereafter, ultrasonic vibration having a frequency greater than or equal to a critical frequency close to the natural frequency of the ingot 40 is applied from the ultrasonic vibration applying means 32 to the ultrasonic vibrator 30. As a result, ultrasonic wave having a frequency greater than or equal to the critical frequency close to the natural frequency of the ingot 40 is applied from the ultrasonic vibrator 30 through the liquid 26 to the ingot 40. Accordingly, a part of the ingot 40 can be efficiently separated along the separation layer 58 as an interface to thereby produce a wafer. Accordingly, the productivity can be improved. In the wafer producing step according to the present invention, it is essential that the first surface 42 as the wafer forming side of the ingot 40 is to be opposed to the ultrasonic vibrator 30. Accordingly, the first surface 42 may be opposed to the ultrasonic vibrator 30 in a vertical direction or in a horizontal direction. Further, the holding means 34 may be oscillated by any suitable oscillating means (not shown) in applying ultrasonic vibration from the ultrasonic vibrator 30 to the ingot 40.

Also in the second preferred embodiment, the above-mentioned critical frequency close to the natural frequency of the ingot 40 is defined in the following manner. In applying ultrasonic wave from the ultrasonic vibrator 30 through the liquid 26 to the ingot 40 immersed in the liquid 26 to thereby separate a part of the ingot 40 along the separation layer 58 as an interface, the frequency of the ultrasonic wave is gradually increased from a frequency lower than the natural frequency of the ingot 40 by a predetermined amount. When the frequency of the ultrasonic wave has reached a certain frequency, a part of the ingot 40 starts to be separated along the separation layer 58 as an interface at this certain frequency. This certain frequency is defined as the critical frequency close to the natural frequency of the ingot 40. That is, the critical frequency close to the natural frequency of the ingot 40 is lower than the natural frequency of the ingot 40. Preferably, the critical frequency close to the natural frequency of the ingot 40 is approximately 0.8 times the natural frequency of the ingot 40. The liquid 26 stored in the liquid bath 28 is preferably water, and the temperature of the water is preferably set to a temperature at which the occurrence of cavitation can be suppressed in applying ultrasonic vibration from the ultrasonic vibration applying means 32 to the ultrasonic vibrator 30. More specifically, the temperature of the water is preferably set to 0° C. to 25° C. In this condition, there is no possibility that the energy of the ultrasonic wave may be converted into cavitation, so that the energy of the ultrasonic wave can be effectively applied to the ingot 40.

The present inventor performed a test on the critical frequency close to the natural frequency of the single crystal SiC ingot and on the temperature of the liquid stored in the liquid bath in the separating apparatus. The test was performed under the following laser processing conditions.

Laser Processing Conditions

Wavelength of the pulsed laser beam: 1064 nm
Repetition frequency F: 60 kHz
Average power: 1.5 W
Pulse width: 4 ns
Spot diameter: 3 μm
Numerical aperture (NA) of the focusing lens: 0.65
Feed speed V: 200 mm/second (Test 1) Formation of a Proper Separation Layer A single crystal SiC ingot having a thickness of 3 mm was used for the test. The focal point of the pulsed laser beam was set in the ingot at a depth of 100 μm from the end surface of the ingot. Then, the pulsed laser beam was applied to the ingot to thereby form a plurality of continuous modified portions each having a diameter of 17 μm, wherein SiC has been decomposed into Si and C. These continuous modified portions were overlapped in the feeding direction at an overlap rate R of 80%. That is, the overlap rate R between any adjacent ones of the plural modified portions continuously formed in the feeding direction was 80%. Further, a plurality of cracks each having a diameter of 150 μm were formed isotropically on the c-plane so as to extend from each modified portion. Thereafter, the focusing means was indexed by 150 μm to similarly form a plurality of continuous modified portions and cracks, thereby forming a separation layer at the depth of 100 μm, which corresponds to the thickness of a wafer to be produced. The overlap rate R can be calculated from the diameter D of each modified portion (D=17 μm in this test) and the spacing L of the adjacent focal points spaced in the feeding direction, wherein the spacing L of the adjacent focal points spaced in the feeding direction is defined by the feed speed V (V=200 mm/second in this test) and the repetition frequency f of the pulsed laser beam (F=60 kHz in this test) as described above (L=V/F).

$R = (D - L)/D$ $= \{D - (V/F)\}/D$ $= [17 \ (\mu m) - \{200 \ (mm/second)/60 \ (kHz)\}]/17 \ (\mu m)$ $= [17 \times 10^{-6} \ (m) - \{200 \times 10^{-3} \ (m/second)/60 \times 10^{3} \ (Hz)\}]/17 \times 10^{-6} \ (m)$ $= 0.8$ (Test 2) Dependence on the Frequency of Ultrasonic Wave in Relation to the Natural Frequency The natural frequency of the single crystal SiC ingot having a thickness of 3 mm mentioned above was determined as 25 kHz. In Test 2, the single crystal SiC ingot in which the separation layer was formed in Test 1 was immersed in water having a temperature of 25° C. Further, the power of ultrasonic wave to be applied to the ingot was set to 100 W, and the frequency of the ultrasonic wave was changed in the sequence of 10 kHz, 15 kHz, 20 kHz, 23 kHz, 25 kHz, 27 kHz, 30 kHz, 40 kHz, 50 kHz, 100 kHz, 120 kHz, and 150 kHz. In this condition, the ultrasonic wave was applied to the ingot immersed in the water to thereby separate the wafer from the ingot along the separation layer as an interface. Then, the time required for the separation of the wafer at each frequency was measured to verify the frequency dependence.

Result of Test 2

| Frequency | Separation time |
|---|---|
| 10 kHz | Not separated even after 10 minutes elapsed: NG |
| 15 kHz | Not separated even after 10 minutes elapsed: NG |
| 20 kHz | Separated in 90 seconds |
| 23 kHz | Separated in 30 seconds |
| 25 kHz | Separated in 25 seconds |
| 27 kHz | Separated in 30 seconds |
| 30 kHz | Separated in 70 seconds |
| 40 kHz | Separated in 170 seconds |
| 50 kHz | Separated in 200 seconds |
| 100 kHz | Separated in 220 seconds |
| 120 kHz | Separated in 240 seconds |
| 150 kHz | Separated in 300 seconds |

(Test 3) Dependence on the Power of Ultrasonic Wave

In Test 2, the power of the ultrasonic wave was fixed to 100 W and the frequency of the ultrasonic wave was changed to measure the time required for separation of the wafer from the ingot along the separation layer formed in Test 1. In contrast thereto, Test 3 was performed in the condition where the power of the ultrasonic wave was changed in the sequence of 200 W, 300 W, 400 W, and 500 W at each frequency used in Test 2 to measure the time required for separation of the wafer from the ingot along the separation layer formed in Test 1. Then, the power dependence was verified. The symbol "NG" shown below is similar in meaning to that used in Result of Test 2. That is, the symbol "NG" means that the wafer was not separated from the ingot even after 10 minutes elapsed from the time of starting the application of the ultrasonic wave to the ingot.

Result of Test 3

| | Separation time at each power | | | |
|---|---|---|---|---|
| Frequency | 200 W | 300 W | 400 W | 500 W |
| 10 kHz | NG | NG | NG | NG |
| 15 kHz | NG | NG | NG | NG |
| 20 kHz | 50 sec | 33 sec | 15 sec | 6 sec |
| 23 kHz | 16 sec | 10 sec | 4 sec | 3 sec |
| 25 kHz | 3 sec | 1 sec | ≤1 sec | ≤1 sec |
| 27 kHz | 15 sec | 11 sec | 5 sec | 2 sec |
| 30 kHz | 48 sec | 40 sec | 18 sec | 3 sec |
| 40 kHz | 90 sec | 47 sec | 23 sec | 4 sec |
| 50 kHz | 100 sec | 58 sec | 24 sec | 6 sec |
| 100 kHz | 126 sec | 63 sec | 26 sec | 7 sec |
| 120 kHz | 150 sec | 70 sec | 27 sec | 8 sec |
| 150 kHz | 170 sec | 82 sec | 42 sec | 20 sec | sec: second(s)

(Test 4) Temperature Dependence

In Test 4, the ingot in which the separation layer was formed in Test 1 was immersed in water, and the temperature of this water was increased from 0° C. to measure the time required for separation of the wafer from the ingot along the separation layer formed in Test 1. Then, the temperature dependence was verified. In Test 4, the frequency of the ultrasonic wave was set to 25 kHz and the power of the ultrasonic wave was set to 500 W.

Result of Test 4

| Temperature | Separation time |
|---|---|
| 0° C. | 0.07 sec |
| 5° C. | 0.09 sec |
| 10° C. | 0.12 sec |
| 15° C. | 0.6 sec |
| 20° C. | 0.8 sec |
| 25° C. | 0.9 sec |
| 30° C. | 3.7 sec |
| 35° C. | 4.2 sec |
| 40° C. | 6.1 sec |
| 45° C. | 7.1 sec |
| 50° C. | 8.2 sec | sec: second(s)

From Result of Test 2, it was verified that the critical frequency of the ultrasonic wave for separation of the wafer from the ingot is dependent on the natural frequency of the ingot (25 kHz in this test) and that this critical frequency is 20 kHz close to the natural frequency of the ingot (this critical frequency is 0.8 times the natural frequency of the ingot). Further, it was also verified that when the frequency of the ultrasonic wave is in the range of 20 to 30 kHz in the vicinity of the natural frequency of the ingot (this frequency range is 0.8 to 1.5 times the natural frequency of the ingot), the wafer is separated from the ingot along the separation layer as an interface effectively (in a relatively short period of time). From Result of Test 3, it was verified that even when the frequency of the ultrasonic wave is greater than the frequency range of 20 to 30 kHz which is in the vicinity of the natural frequency of the ingot, the wafer is effectively separated from the ingot along the separation layer as an interface by increasing the power of the ultrasonic wave. From Result of Test 4, it was verified that when the temperature of the water as the liquid stored in the liquid bath of the separating apparatus is greater than 25° C., the energy of the ultrasonic wave is converted into cavitation, so that the wafer cannot be effectively separated from the ingot along the separation layer as an interface.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An SiC wafer producing method for producing an SiC wafer from a single crystal SiC ingot having a first end surface and a second end surface, a c-axis intersecting both said first end surface and said second end surface, a c-plane perpendicular to said c-axis, and a natural frequency, said SiC wafer producing method comprising:

a separation layer forming step of setting a focal point of a laser beam having a transmission wavelength to single crystal SiC inside said SiC ingot at a predetermined depth from said first end surface, said predetermined depth corresponding to a thickness of said SiC wafer to be produced, and next applying said laser beam to said SiC ingot, thereby forming a plurality of modified portions on said c-plane at said predetermined depth and also forming a plurality of cracks isotropically formed on said c-plane so as to extend from each modified portion, each modified portion being a region where SiC has been decomposed into Si and C, said modified portions and said cracks constituting a separation layer along which said SiC wafer is to be separated from said SiC ingot; and a wafer producing step of, after the separation layer forming step, separating a part of said SiC ingot along said separation layer as an interface, thereby producing said SiC wafer;

said wafer producing step including the steps of immersing said SiC ingot in a liquid in the condition where said first end surface of said SiC ingot is opposed to an ultrasonic vibrator for generating ultrasonic wave, and next applying said ultrasonic wave from said ultrasonic vibrator through said liquid to said SiC ingot, thereby separating said SiC wafer from said SiC ingot, said ultrasonic wave having a frequency greater than or equal to a critical frequency close to the natural frequency of said SiC ingot, wherein said critical frequency close to the natural frequency of said SiC ingot is 0.8 times the natural frequency of said SiC ingot, wherein said c-axis is inclined by an off angle with respect to a normal to said first end surface of said SiC ingot, wherein the c-axis and the normal intersect each other at said second end surface, and thereby the c-plane is inclined by said off angle with respect to said first end surface of said SiC ingot, and wherein said separation layer forming step includes:

a modified portion forming step of applying said laser beam to said SiC ingot in the condition where said focal point is set at said predetermined depth as relatively linearly feeding said SiC ingot and said focal point in a first direction perpendicular to a second direction, and where the second direction is defined as a direction parallel to a line connecting a point where the c-axis intersects said first end surface to a point where the normal intersects said first end surface, thereby continuously forming said modified portions so that any adjacent ones of said modified portions overlap each other in said first direction; and an indexing step of relatively indexing said SiC ingot and said focal point in said second direction by a predetermined amount in the range not greater than the width of said cracks; and said modified portion forming step and said indexing step being alternately performed to form said separation layer, in which said cracks adjacent to each other in said second direction are connected.

2. The SiC wafer producing method according to claim 1, wherein said liquid includes water, the temperature of said water being set to a temperature at which the occurrence of cavitation is suppressed.

3. The SiC wafer producing method according to claim 2, wherein the temperature of said water is in the range of 0° C. to 25° C.

4. The SiC wafer producing method according to claim 1, wherein said ultrasonic vibrator is immersed in the liquid.

5. The SiC wafer producing method according to claim 1, wherein said wafer producing step is performed by a separating apparatus which includes a holding means for holding the SiC ingot;

said holding means including an arm and a suction member fixed to an end of the arm;

said suction member having a surface for holding the SiC ingot under suction from an upper surface of the SiC ingot.

\* \* \* \* \*